United States Patent [19]
Goela et al.

[11] Patent Number: 5,354,580
[45] Date of Patent: Oct. 11, 1994

[54] TRIANGULAR DEPOSITION CHAMBER FOR A VAPOR DEPOSITION SYSTEM

[75] Inventors: Jitendra S. Goela, Andover; Lee E. Burns, Woburn; ALexander Teverovsky, Concord; James C. MacDonald, Stoneham, all of Mass.

[73] Assignee: CVD Incorporated, Woburn, Mass.

[21] Appl. No.: 73,862

[22] Filed: Jun. 8, 1993

[51] Int. Cl.$^5$ ............................................. C23C 16/00
[52] U.S. Cl. ................................ 427/248.1; 118/715; 118/725; 264/81
[58] Field of Search .......................... 118/725, 715; 427/248.1; 264/81

[56] References Cited
U.S. PATENT DOCUMENTS

| | | | |
|---|---|---|---|
| 4,963,393 | 10/1990 | Goela | 427/248.1 |
| 4,981,102 | 1/1991 | Gautreaux | 118/725 |
| 4,990,374 | 2/1991 | Kelley | 118/725 |

*Primary Examiner*—Richard Bueker
*Attorney, Agent, or Firm*—Gerald K. White

[57] ABSTRACT

A process and apparatus for the manufacture of chemical vapor deposited silicon carbide which comprises conveying the reaction gases to a triangular chemical vapor deposition cell where material is deposited by chemical vapor deposition. The triangular cell provides a large surface area for deposition while occupying a minimum amount of the furnace floor surface area. The triangular cell has the added benefit in that deposited silicon carbide is of negligible thickness at the edges thereby permitting easy separation of material with a minimum of post deposition machining.

20 Claims, 4 Drawing Sheets

TRIANGULAR DEPOSITION CHAMBER FOR A VAPOR DEPOSITION SYSTEM

BACKGROUND OF THE INVENTION

1. Field of the Invention

This invention relates to an improved method of and apparatus for the manufacture of stiff, strong, lightweight structures, and more particularly, to an improved method of and apparatus for the manufacturing of silicon carbide and/or silicon lightweight structures by the utilization of improved vapor deposition techniques. Further, this invention relates to a triangular chemical vapor deposition arrangement which can provide high yields of thick ceramic materials or parts from a vapor deposition system.

2. Description of Related Art

In the manufacture of ceramic materials by chemical vapor deposition, gases are introduced into a hot furnace where they react at the walls of the furnace or at the surface of a substrate or mandrel positioned in the furnace to form a solid deposit or coating thereon. Typically, a vacuum furnace designed in the shape of a tubular cylinder having a circular cross section is used for chemical vapor deposition. In the formation of a coating of a ceramic material such as silicon carbide (hereinafter referred to as "SIC"), methyltrichlorosilane ($CH_3SiCl_3$, for convenience termed as "MTS" hereinafter), hydrogen ($H_2$) and argon (Ar) gases are introduced in the reaction chamber through stainless steel injectors. Since MTS is a liquid at room temperature, Ar gas is bubbled through the MTS and carries MTS vapor to the injectors. Unreacted gases, products of reaction, and undeposited solids are evacuated from the furnace and cleaned in a gas scrubber. Thick deposits (greater than 10 mils) of SiC can be manufactured using this process. Typical conditions for the manufacture of SiC by chemical vapor deposition are:

| | |
|---|---|
| Substrate Temperature | 1350° C. (2462° F.) |
| Furnace or Reaction Chamber Pressure | 200 torr |
| Partial Pressure of Gases | |
| Ar | 125 Torr |
| $H_2$ | 60 Torr |
| MTS | 15 Torr |

SiC parts are fabricated by the aforementioned process on a mandrel which is placed perpendicular to the flow, i.e., an impinging flow configuration. The reagents are introduced from several injectors which impinge on the mandrel at different locations and thus produce a more uniform deposit over the whole mandrel area. Efficient recovery of the deposited material without cracking or stressing is an important issue. In order to prevent deposited material from cracking, the mandrel may be isolated from the rest of the furnace using a gas shroud technique as disclosed in Keeley et al., U.S. Pat. No. 4,990,374; or a flexible body is used to prevent backside growth on the mandrel as disclosed in Goela et al., U.S. Pat. No. 4,963,393, both of which patents are assigned to the assignee of the present invention. The impinging flow configuration is preferred when specific parts are to be manufactured by deposition of material on male molds; such as, cones, discs, and cylinders of uniform thickness are required. However, when the objective is to fabricate large amounts of bulk sheet stock or deposit material in female molds, this configuration is inferior due to low values for reagent utilization efficiency.

Reagent utilization efficiency, with respect to vapor deposited material, in general, is defined as a ratio of the weight of material deposited on the mandrel to the total weight of material to be deposited that is contained in the reagents. With respect to SiC, reagent utilization efficiency is defined as a ratio of the weight of SiC deposited on the mandrel to the total weight of SiC in the reagents. In an impinging flow configuration, the reagent utilization efficiency is usually less than 20%. Since the walls of the chemical vapor deposition reactor are also heated, material may deposit on these walls and in the exhaust regions of the furnace. In most cases this material is treated as waste. In principle, one can minimize this waste by increasing the size of the mandrel. However, this requires increasing the furnace diameter, which is costly in a vacuum system. Preferably, the mandrel or mandrels should be so arranged in a chemical vapor deposition furnace to provide the maximum surface area available for deposition while occupying a minimum amount of the furnace floor surface area.

Further, undeposited solids must be removed by a filter system prior to the gases entering the vacuum pumping system. Due to the physical properties of SiC (hardness, 2540 $kg/mm^2$ (Knoop 500 g load); fracture toughness, 3.3 $Mn/m^{1.5}$ (micro-indention); and density 3.21 $g/cm^3$), particles of undeposited material which pass through the exhaust system result in significant wear on process piping, seals, filters and other particulate removal components. Depositing SiC, which would normally be exhausted from the chemical vapor deposition furnace, would present the added advantage of reducing the wear on exhaust gas processing equipment. The resulting reduction in equipment cost associated with the manufacture of SiC would significantly reduce the overall cost of manufacture.

A deposition chamber in which the flow is parallel to the deposition surface provides good potential to obtain high deposition efficiency. Four-sided deposition chambers, formed from mandrel plates in the shape of a box which is open on both ends for the passage of reagents, are known in the art. Normally, sheets of material deposited on the inside surfaces of the mandrel plates arranged in this manner tend to bow and may crack. This condition would be exaggerated in the case of SiC due to its extreme hardness and elastic modulus. Further, material deposited on the inside surfaces of the four walls of the mandrel box grow together at the corners during the deposition process. Normally, this does not present a problem with soft material which is weaker than SiC, as it can be scored, fractured at the score line and easily machined. Due to the unique properties of SiC, extreme hardness and high strength, the scoring, fracturing and machining of SiC would be extremely difficult. Further, this additional step reduces the process yield.

SUMMARY OF THE INVENTION

An object of this invention is to provide a means for the manufacture of material by chemical vapor deposition that affords the maximum surface area for deposition while occupying minimum furnace floor surface area.

A further object of this invention is to provide a means for the manufacture of material by chemical vapor deposition that affords easy and efficient removal of chemical vapor deposited material with minimal loss of product due to cracking.

Another object of this invention is to provide a means for the manufacture of material by chemical vapor deposition that affords a high reagent utilization efficiency.

Another object of this invention is to provide an apparatus having deposition surfaces both parallel and perpendicular to the direction of gas flow.

Another object of this invention is to provide an apparatus which will reduce the wear on process equipment caused by abrasive waste material.

Still another object of this invention is to provide a structure for the deposit of material by chemical vapor deposition that results in chemical vapor deposition material which requires a minimum of post-deposition machining.

These and other objectives of the invention, which will become apparent from the following description, have been achieved by a novel apparatus for the manufacture of structures formed by vapor deposition, comprising a vertical triangular vapor deposition cell which is described hereinbelow. The triangular vapor deposition cell of this invention overcomes many of the aforementioned drawbacks and provides high yields of high quality and thick ceramic material such as SiC.

The apparatus of this invention, for the manufacture of materials by vapor deposition comprises a means for supplying a gas at a controlled rate to a novel vapor deposition cell contained within a vapor deposition furnace. The furnace has a plurality of side walls, a top cover and a bottom cover. A number of first mandrel plates are arranged to form the vapor deposition cell having an outside, an inside, a first end, and a second end. The inside of the vapor deposition cell defines a vapor deposition chamber having a triangular cross section. Preferably, the cross section of the vapor deposition cell is an equilateral triangle. The first mandrel plates are made from a material suitable for use in a vapor deposition furnace. A means to heat the vapor deposition furnace is provided. The gas is conducted to the first end of the vapor deposition chamber, flows through the chamber, and exits the vapor deposition chamber carrying with it any undeposited solids in the gas stream. The gas flowing through the vapor deposition chamber flows parallel to the surface of the heated mandrel plates. Material is deposited onto the heated mandrel plates to form a vapor deposited structure.

In addition, a second mandrel plate may be located within the vapor deposition chamber or immediately outside the vapor deposition chamber in a spaced relationship to the second end of the vapor deposition chamber and perpendicular to the flow of the reaction gas. A number of vapor deposition cells, with or without the second mandrel plates, can be arranged to form a vapor deposition unit having increased surface area. For example, with the aforementioned triangular form described herein, six vapor deposition cells can be arranged in the shape of a hexagon.

The vapor deposition cell can be oriented horizontally or vertically. When the vapor deposition cell is oriented vertically, the gas can be made to flow substantially in the same direction to the force of gravity or substantially in the opposite direction to the force of gravity. The apparatus of this invention can be used for vapor deposition and, in particular, chemical vapor deposition of materials such as, but not limited to, SiC, zinc sulfide, and zinc selenide. A vapor deposition cell of this invention arranged in this manner can achieve a reagent utilization efficiency of at least 50%, preferably at least 55%, and more preferably at least 75%.

Also, this invention includes a process for the manufacture of materials by vapor deposition comprising supplying a gas at a controlled rate to a novel vapor deposition cell contained in a vapor deposition furnace as described hereinabove. The vapor deposition chamber is heated and the gas is conducted to the first end of said vapor deposition chamber. The gas flows through the vapor deposition chamber from the first end to the second end where any unreacted gases and undeposited solids exits the vapor deposition chamber. The gas flow is parallel to the surface of the heated mandrel plates. Material is deposited onto the heated mandrel plates to form a vapor deposited structure. The process of this invention can be used for vapor deposition and, in particular, chemical vapor deposition of materials such as, but not limited to, SiC, zinc sulfide, and zinc selenide. A vapor deposition process of this invention can achieve a reagent utilization efficiency of at least 50%, preferably at least 55%, and more preferably at least 75%.

BRIEF DESCRIPTION OF THE DRAWINGS

With this description of the invention, a detailed description follows with reference being made to the accompanying figures of drawings which form part of the specification related thereto, in which like parts are designated by the same reference numbers, and of which.

DETAILED DESCRIPTION OF THE INVENTION

Description of the Preferred Embodiments

Figure 1:
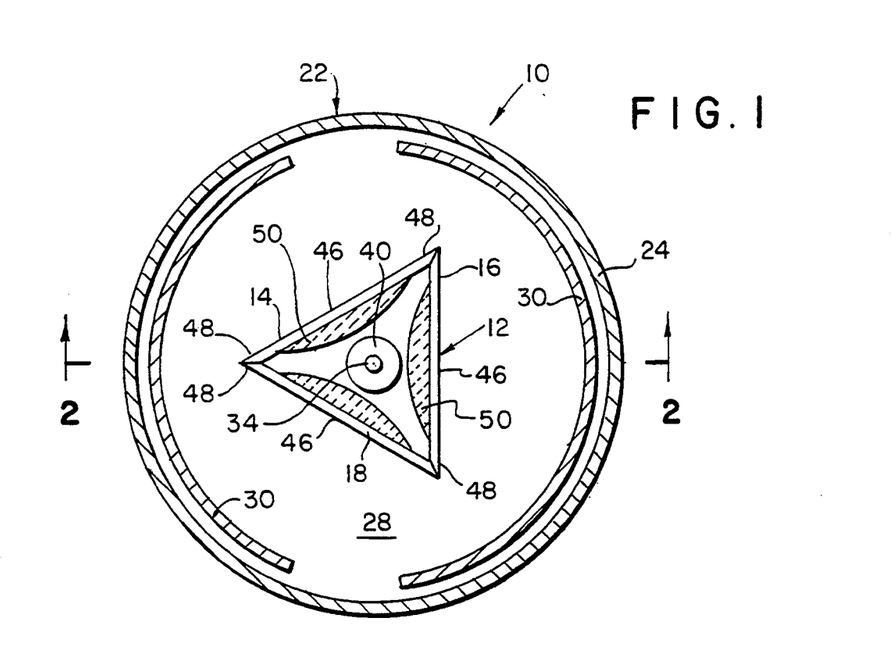
FIG. 1 is a top-plan view of a chemical vapor deposition furnace illustrating the arrangement of a single chemical vapor deposition cell of this invention in the furnace.
Figure 2:
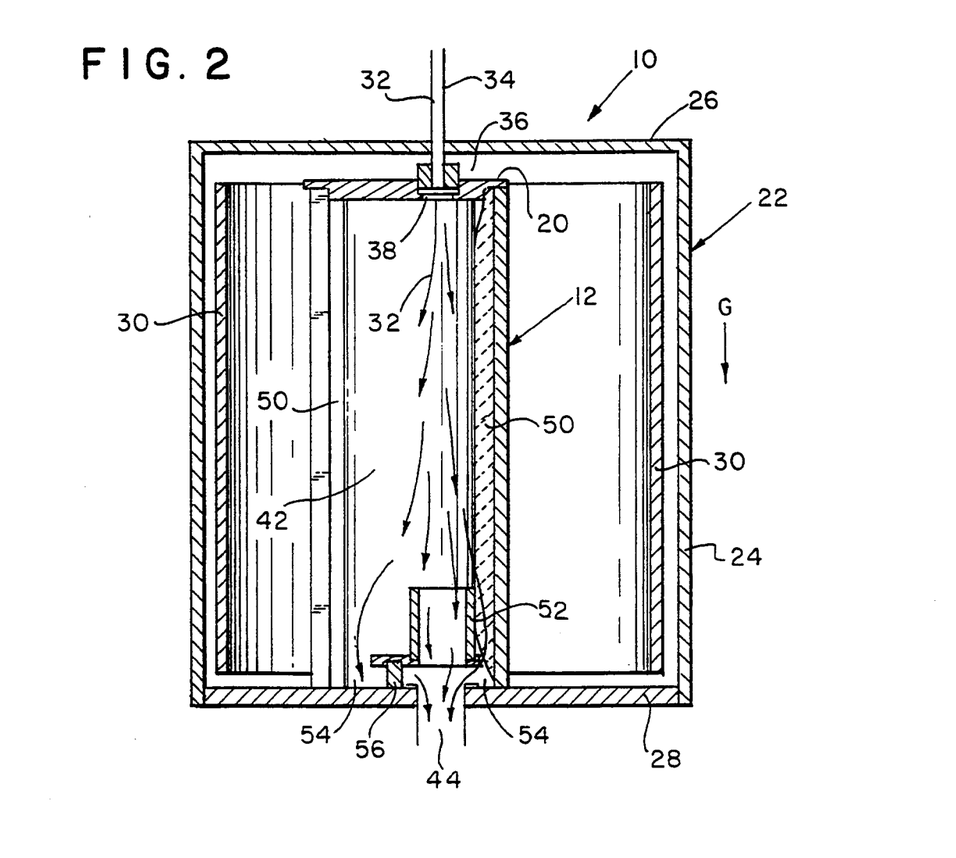
FIG. 2 is a cross-sectional view taken along line 2—2 of FIG. 1 illustrating the arrangement of a chemical vapor deposition furnace using the chemical vapor deposition cell of this invention with gas flow in the same direction as the force of gravity.

The vapor deposition apparatus of this invention is shown generally at 10 in FIGS. 1 and 2. The apparatus comprises a triangular cell 12 with walls 14, 16, and 18, of approximately equal width and a length about 2 to 2-½ times the width. The walls 14, 16, and 18, support a chemical vapor deposition triangular cell cover plate 20. The triangular cell 12 is contained in a vacuum furnace 22 having an outer wall 24, a cover plate 26, and a base plate 28. Heating elements 30 are used to increase the temperature of the chemical vapor deposition furnace 22 and the walls 14, 16, and 18, of the triangular cell 12 to operating temperature and maintain the vacuum furnace 22 and triangular cell 12 at operating temperature during the chemical vapor deposition process. Referring to FIG. 2, a reaction gas 32, along with carrier gases (argon and hydrogen) pass through inlet tube 34 and are introduced from the top (inlet side) 36 of the vacuum furnace 22 through an injector 38 placed approximately in the center 40 of the triangular chamber cover plate 20, as shown in FIG. 1. The reaction gas 32 and carrier gases pass through the deposition zone 42 in the triangular cell 12 and unreacted gases exit through exhaust port 44.

As a consequence of the triangular shape, as shown in FIG. 1, the distance of the injector 38 from the center 46 of a wall (14, 16, and 18) to an edge 48 of a wall (14, 16, and 18) varies by a factor of two, for an equilateral triangle. This variation is very beneficial in ensuring a tapering of the thickness of deposited material 50 from the centers 46 of a wall (14, 16, and 18) to the corresponding edges 48 of a wall (14, 16, and 18). The variation of the thickness of deposited material 50 from the center 46 to the edge 48 is most clearly illustrated in FIG. 7. Thus, thick deposited material 50 can be deposited in the center 46 of a wall and still the material at the edge 48 of the corresponding wall may be quite thin, thus permitting separation of the deposited material 50 without the use of a machining step. No other geometrical shape (i.e., square, pentagon, etc.) provides such large ratio of the distance from a centrally located injector to the center 46 of the wall (14, 16, and 18) and from the injector 38 to the wall edge 48. Another advantage of the regular triangular geometry is that it provides the maximum ratio of the perimeter to the area of any known regular shape (i.e., square, circle, etc.). Consequently, the triangular cell 12 has a greater potential to provide higher reagent utilization efficiency for the same volume of the deposition zone.

Another advantage of the vertical triangular cell 12 is that it provides for fewer inclusions in the product than an impinging flow configuration in which the mandrels are facing upward. With the apparatus of this invention, the mandrel walls oriented vertical, any particulates that may fall from the injector due to gravity are swept to the exhaust region due to the force of gravity and the flow of the reaction gas. On the other hand, with the impinging flow configuration, the force of gravity and the flow of the reaction gas tends to push the particulates toward the mandrel where they are incorporated in the product as inclusions. Thus, the triangular deposition arrangement of this invention will provide a product of equal or higher quality compared to a product produced by the impinging flow arrangement.

A deposition tube 52 for the passage of reagents may be placed at the bottom (exhaust side) 54 of the triangular cell 12 on support 56. The reaction gas 32 can flow around the deposition tube 52, through it, or around it and underneath it, before exiting through the exhaust port 44 and into the exhaust gas treatment system (not shown). The deposition tube 52 can function as an additional deposition surface to form three-dimensional parts of chemically vapor deposited material, in particular SiC.

Figure 5:
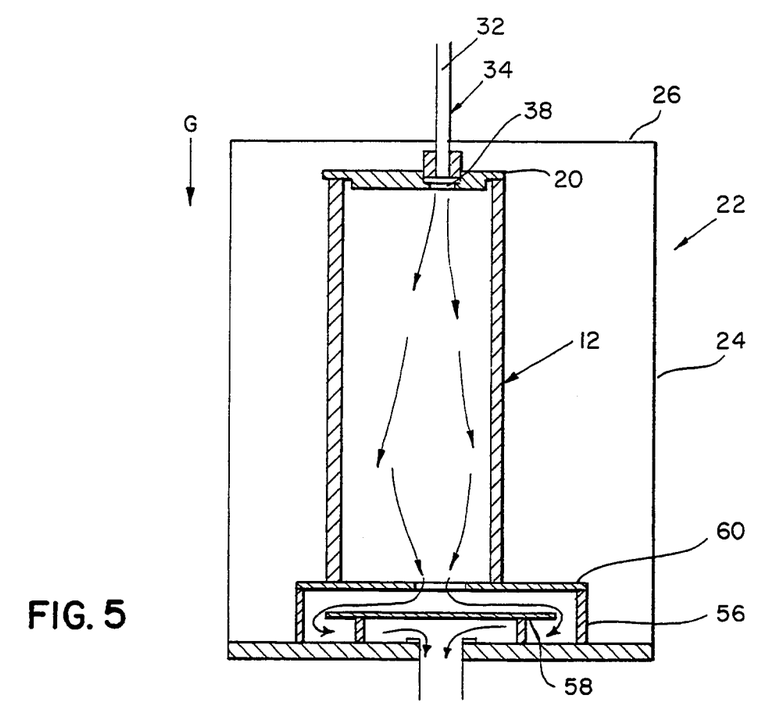
FIG. 5 is a cross-sectional view illustrating a mandrel plate at the bottom of the furnace perpendicular to the flow of the reaction gas.

In addition to and independent from the deposition tube 52, a second mandrel plate 58 may be placed perpendicular to the flow of gas, as shown in FIG. 5. When the reaction gas 32 is made to flow substantially in the same direction as the force of gravity, as is shown in FIG. 5, the triangular cell 12 is supported by a false bottom 60. The second mandrel plate 58 is then placed below the triangular cell 12 perpendicular to the flow of the reaction gas 32 under the false bottom 60. This provides an additional deposition surface for depositing material by impinging flow. Surfaces for impinging flow are required when chemical vapor deposition of SiC structures are to be deposited over male molds in order to provide uniformly deposited material. The second mandrel plate 58 functions as a baffle to redirect the flow of reaction gas 32. In the arrangement shown is FIG. 5, the second mandrel plate 58 may be isolated from the rest of the furnace using the selective area chemical vapor deposition process which was disclosed in the aforementioned U.S. Pat. No 4,990,374.

Figure 6:
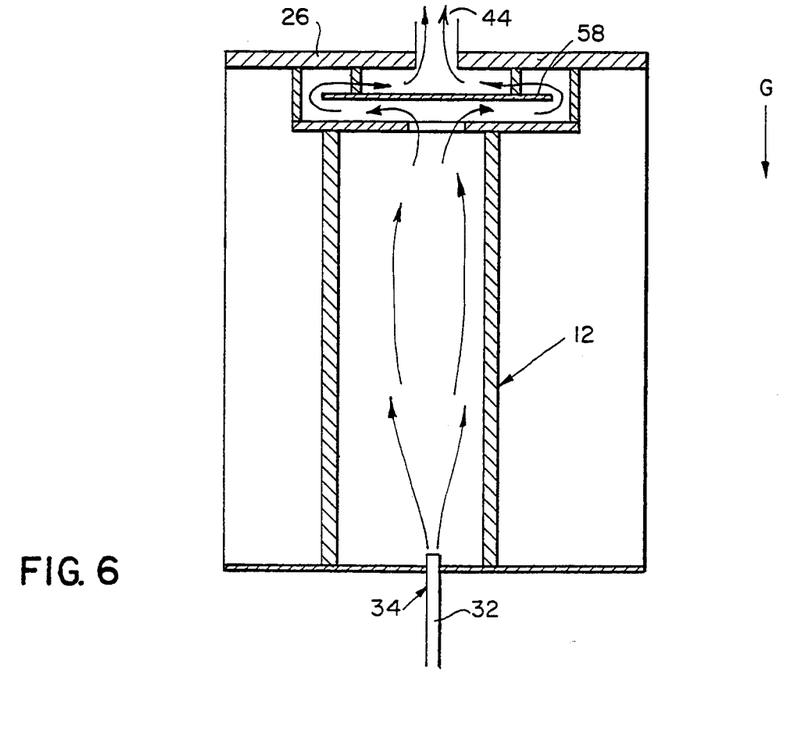
FIG. 6 is a cross-sectional view illustrating the arrangement of a chemical vapor deposition furnace using the chemical vapor deposition cell of this invention with gas flow opposite to the force of gravity.

Also, the second mandrel plate 58 can be placed at the top of the chemical vapor deposition furnace 22 as shown in FIG. 6. This arrangement is used when the flow of the reaction gas 32 is opposite to the flow of gravity. This arrangement is believed to produce a product with a very low level of inclusions, as particulate impurities which would normally become trapped in the deposited material 50 on the second mandrel plate 58 are removed from the gas stream due to the force of gravity. The invention disclosed in the aforementioned U.S. Pat. No. 4,990,374, is not applicable for use with the second mandrel plate 58 as it is used as shown in FIG. 6.

Figure 3:
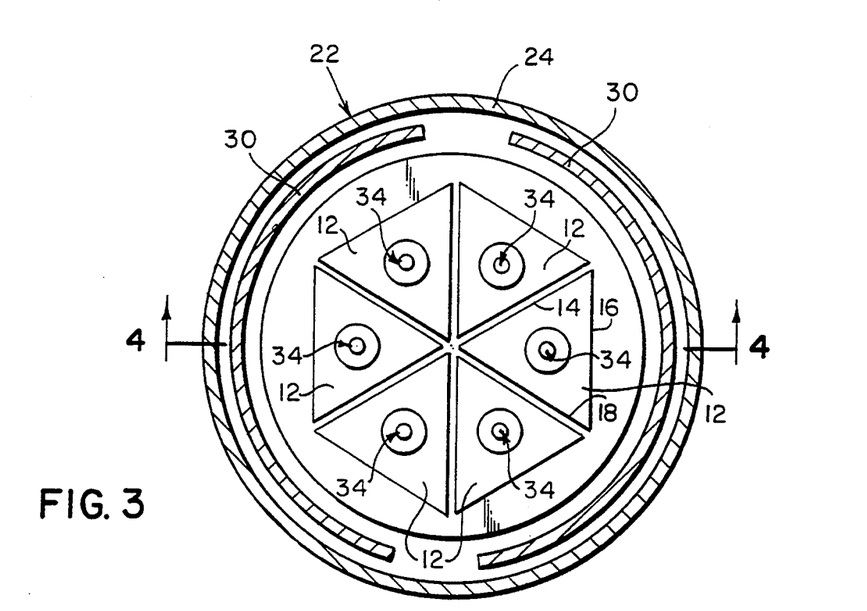
FIG. 3 is a top-plan view of a chemical vapor deposition furnace illustrating the arrangement of multiple chemical vapor deposition cells of this invention within a furnace.
Figure 4:
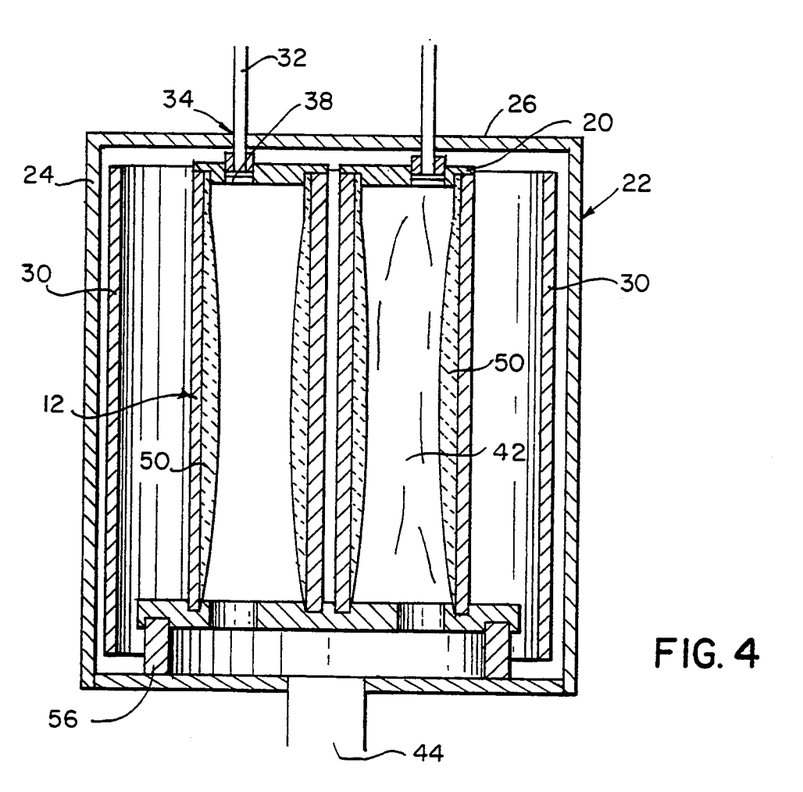
FIG. 4 is a cross-sectional view taken along line 4—4 of FIG. 3 illustrating the arrangement of multiple chemical vapor deposition cells of this invention within a furnace.

The triangular deposition cell 12 is well suited for scaling. Normally, vacuum furnaces are designed as a cylinder. Consequently, it is easier to closed pack triangular deposition cells in a round furnace than square or cylindrical cells. FIGS. 3 and 4 show six triangular cells 12 which are arranged in the form of a hexagon. One injector is used in each triangular cell to supply reagents. This closed pack arrangement provides considerable surface area for deposition of material and is a very compact in design. For instance, six triangles, each with sides 8-inches wide and length 27-inches long, will provide a total deposition of about 3900 square inches but can be accommodated in a furnace of 25-inch diameter. To obtain the same deposition area in an impinging flow configuration, one would require a furnace of at least 71-inch in diameter.

The walls 14, 16, and 18, can be made of any material which is compatible with the chemical vapor deposition process, such as graphite, but not limited to; silicon (Si), silicon carbide (SIC), molybdenum (Mo), tungsten (W), or tantalum (Ta). Graphite is the preferred material because; (i) it is a high-temperature material compatible with the SiC process, (ii) it is relatively cheap and easy to fabricate, and (iii) one can use that grade of graphite with the coefficient of thermal expansion (hereinafter referred to as "CTE") closely matching that of SiC. This latter advantage minimizes stresses in SiC when the material is cooled from the deposition temperature to room temperature. The vacuum furnace 22 for use with this invention can be any furnace suitable for use with chemical vapor deposition applications.

Figure 7:
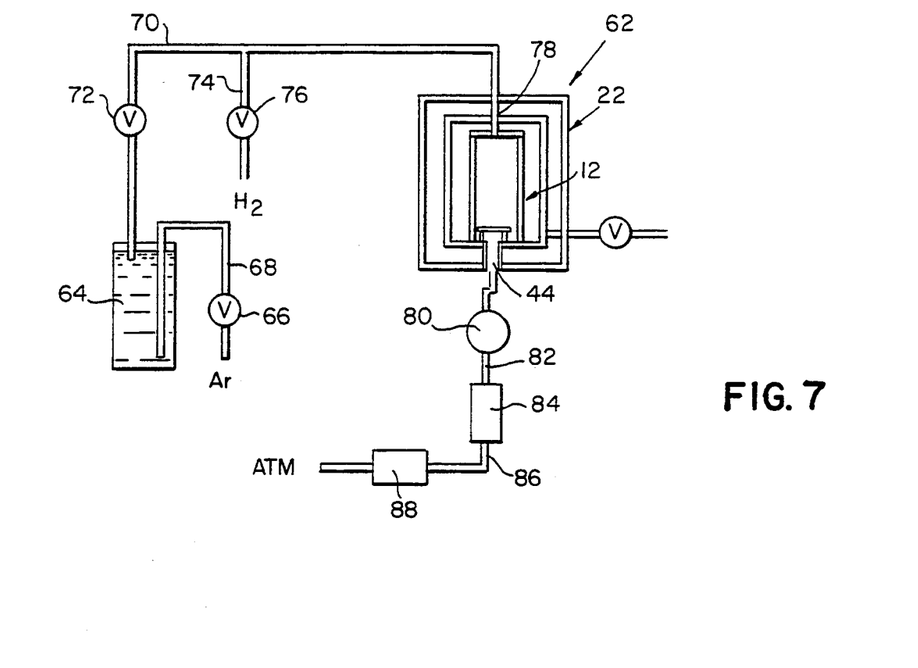
FIG. 7 is a schematic illustration of a chemical vapor deposition system in which the chemical vapor deposition cell of FIG. 2 and 4 may be incorporated.

FIG. 7 is a schematic illustration of a chemical vapor deposition system 62 that may be used with the triangular cell 12 of this invention. As seen in FIG. 7, argon enters a bubbler chamber 64 from a suitable source (not shown) by way of a valve 66 and a flow line 68. Bubbler chamber 64 may contain MTS or trichlorosilane (SiHCl3, hereinafter referred to as "TS"). MTS is preferred to produce a SiC deposit. TS is preferred to produce a Si deposit. As those skilled in the art will understand, however, other hydrocarbon and silane sources can be used to produce SiC and Si deposits. Both of these deposits have been fabricated over a wide range of deposition temperatures and reaction chamber pressures.

Argon bubbles carrying the reagent MTS or TS enter a flow line 70 under the control of a valve 72. Hydrogen enters the flow line 70 through a flow line 74 from a suitable source (not shown) under the control of a valve 76. The hydrogen gas may be purified as discussed in copending application, U.S. Ser. No. 08/058,608, filed on May 6, 1993, and assigned to the assignee of this application. The reagents may be introduced into a triangular cell 12 of the chemical vapor deposition system 62 through injectors 78 which may be identical to the injectors 32 shown in FIG. 2. Material is deposited on walls 14, 16, and 18 of triangular cell 12. The triangular cell 12 as described in the aforementioned discussion may be heated to a temperature in the range between about 830° C. and 1350° C. by heating elements 30.

Gaseous products are removed from the triangular cell 12 through exhaust port 44, through filter 80, and through a flow line 82 to a vacuum pump 84. From the vacuum pump 84, the gases are conveyed through a flow line 86 to a scrubber 88. The scrubbed gases are then vented to the atmosphere.

Examples

The triangular deposition setup of FIGS. 1 and 2 was used to deposit SiC. The process conditions used were: mandrel temperature=1350° C., furnace pressure=200 torr, flow rates, Ar: 13 slpm, H2:22 slpm, MTS=5.1 slpm (slpm is standard liters per minute measured at atmospheric pressure and 20° C.). The SiC deposition was performed for 76 hours.

Figure 8:
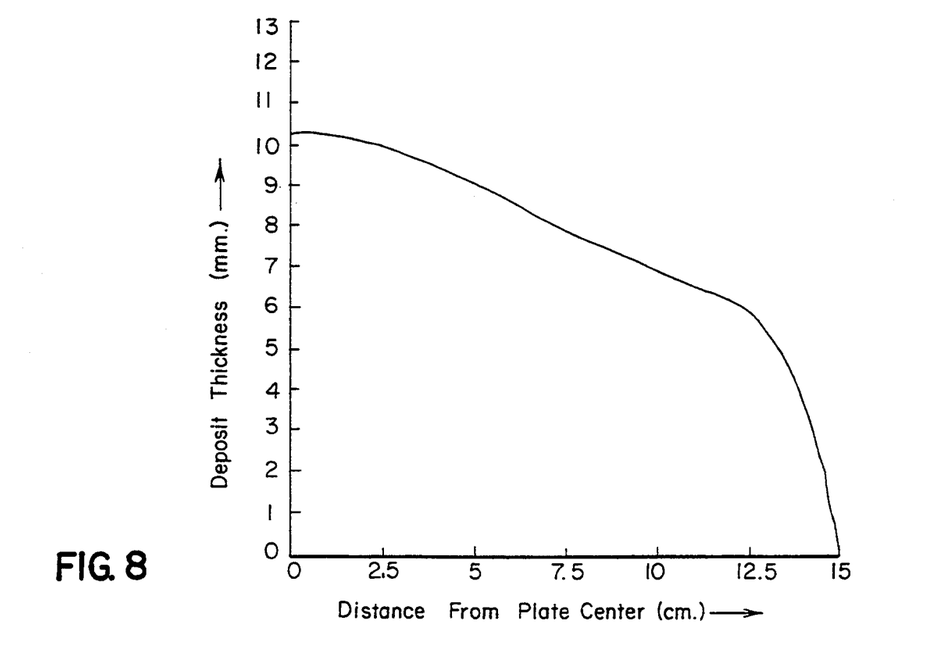
FIG. 8 is a graphical presentation of the cross section of deposited material illustrating the variation of the material thickness from the center to the edge.

Examination of the deposit indicated a fairly uniform thickness profile out to the edge and a steep tapering of thickness near the edge. The deposit thickness was about 0.35 inch. A thickness profile appears in FIG. 8, illustrating the relative thickness of the material from the center of the plate to the edges. The weight of the material deposited on the mandrel was measured, and the deposition efficiency was determined to be about 55%. The SiC deposit was slightly joined at the edges, but the SiC plates were readily separated without performing any machining operation. No cracking of the material was observed. The material was taken from two different locations on the mandrel and characterized for thermal conductivity, hardness, fracture toughness, thermal expansion coefficient, polishability, chemical purity, grain size and crystal structure, and the results were compared with those of our regular chemical vapor deposited SiC (produced in an impinging flow configuration). These results are shown in Table 1. From the following Table, it can be seen that the important physical, thermal, and optical properties of this material are comparable to those of chemical vapor deposited SiC produced with an impinging flow apparatus. The chemical purity of SiC produced by the apparatus and process of this invention are comparable to SiC manufactured by prior processes. Thus, the vertical triangular setup produces chemical vapor deposited SiC of quality comparable to our regular chemical vapor deposited SiC.

TABLE

Comparison of Important Properties of SiC formed by chemical vapor deposition Produced in the Triangular Vertical Setup and an Impinging Flow Arrangement

| Property | CVD SiC (Impinging Flow Arrangement) | CVD SiC (Triangular Vertical Cell) |
|---|---|---|
| Hardness (kg mm$^{-2}$) | 2540 (500 g load) | 2520 (1000 g load) |
| Fracture toughness (MNm$^{-3/2}$) | 3.3 | 3.4 |
| Crystal structure | polycrystalline | polycrystalline |
| Average grain size ($\mu$m) | 10 | 10 |
| Coefficient of thermal expansion (K$^{-1}$ × 10$^{-6}$) @ | | |
| 473K | 3.7 | 3.6 |
| 673K | 4.4 | 4.5 |
| 873K | 4.8 | 4.9 |
| 1073K | 5.0 | 5.1 |
| 1273K | 5.0 | 5.2 |
| 1373K | 4.6 | 5.3 |
| Thermal conductivity (Wm$^{-K-1}$) @ 20° C. | 250 | 315 |
| Polishability | <1 Å RMS | <1 Å RMS |

Thus, in accordance with the invention, there has been provided an apparatus and process which provides a means for depositing material by chemical vapor deposition that affords the maximum surface area for deposition while occupying a minimum of area of furnace floor space. The apparatus and process of this invention also provide a means for depositing material by chemical vapor deposition that affords easy and efficient removal of chemical vapor deposited material with minimal loss of product due to cracking. Further, this invention provides a means for depositing of material by chemical vapor deposition that affords a high reagent utilization efficiency. Further, this invention provides an apparatus and process which reduces the wear on process equipment caused by abrasive waste material. Also, this invention provides a means for depositing material by chemical vapor deposition that results in chemical vapor deposition material which requires a minimum of post-deposition machining.

With this description of the invention in detail, it will be appreciated by those skilled in the art that modification may be made to the invention without departing from the spirit thereof. Therefore, it is not intended that the scope of the invention be limited to the specific embodiments that have been illustrated and described. Rather, it is intended that the scope to the invention be determined by the proper scope and fair meaning of the accompanying claims.

We claim:

1. An apparatus for the manufacture of materials by vapor deposition comprising:

a means for supplying a gas at a controlled rate;

a vapor deposition furnace, having a plurality of side walls, a top cover and a bottom cover;

a plurality of first mandrel plates within said vapor deposition furnace, said first mandrel plates made from a material suitable for use in a vapor deposition furnace, wherein said first mandrel plates are arranged to form a vapor deposition cell having an outside, an inside, a first end, and a second end, said inside of said vapor deposition cell defining a vapor deposition chamber having a triangular cross section;

a means to heat said vapor deposition chamber; and a means to conduct said gas to said first end of said vapor deposition chamber such that said reaction gas will flow through said vapor deposition chamber from said first end to said second end where said gas exits the vapor deposition chamber;

wherein said gas flows parallel to the surface of the heated mandrel plates and said gas is deposited onto said heated mandrel plates to form a vapor deposited structure.

2. The apparatus of claim 1 wherein the cross section of the vapor deposition furnace is substantially an equilateral triangle.

3. The apparatus of claim 1 further comprising a second mandrel plate located within said vapor deposition chamber in spaced relationship to said second end of said vapor deposition chamber and perpendicular to the flow of said reaction gas.

4. The apparatus of claim 1 further comprising the arrangement of a plurality of vapor deposition cells arranged to form a vapor deposition unit having an outside perimeter in the shape of a hexagon.

5. The apparatus of claim 1 wherein the vapor deposition cell is oriented vertically.

6. The apparatus of claim 5 wherein said means to conduct said gas to said first end of said furnace is such that the flow of said gas is substantially in the same direction to the force of gravity.

7. The apparatus of claim 5 wherein said means to conduct said gas to said first end of said furnace is such that the flow of said gas is substantially in the opposite direction to the force of gravity.

8. The apparatus of claim 3 wherein the vapor deposition cell is oriented vertically.

9. The apparatus of claim 8 wherein means to conduct said gas to said first end of said furnace is such that the flow of said gas is substantially in the same direction as the force of gravity.

10. The apparatus of claim 8 wherein said means to conduct said gas to said first end of said furnace is such that the flow of said gas is substantially in the opposite direction to the force of gravity.

11. The apparatus of claim 1 wherein the means for supplying a reaction gas is a source of methyltrichlorosilane.

12. A process for the manufacture of materials by vapor deposition having a high gas utilization efficiency comprising:

supplying a gas at a controlled rate to a vapor deposition furnace, having a plurality of side walls, a top cover and a bottom cover, a plurality of first mandrel plates within said vapor deposition furnace, said first mandrel plates made from a material suitable for use in a vapor deposition furnace, wherein said first mandrel plates are arranged to form a vapor deposition cell having an outside, an inside, a first end, and a second end, said inside of said vapor deposition cell defining a vapor deposition chamber having a triangular cross section;

heating said vapor deposition chamber; and conducting said gas to said first end of said vapor deposition chamber such that said reaction gas will flow through said vapor deposition chamber from said first end to said second end where said gas exits the vapor deposition chamber;

wherein said gas flows parallel to the surface of the heated mandrel plates and said gas is deposited onto said heated mandrel plates to form a vapor deposited structure.

13. A process for the manufacture of silicon carbide structures by chemical vapor deposition having a high gas utilization efficiency comprising:

supplying a reaction gas at a controlled rate to a chemical vapor deposition furnace, having a plurality of side walls, a top cover and a bottom cover;

a plurality of first mandrel plates within said chemical vapor deposition furnace, said first mandrel plates made from a material suitable for use in a chemical vapor deposition furnace, wherein said first mandrel plates are arranged to form a chemical vapor deposition cell having an outside, an inside, a first end, and a second end, said inside of said chemical vapor deposition cell defining a chemical vapor deposition chamber having a triangular cross section;

heating said chemical vapor deposition chamber; and conducting said reaction gas to said first end of said chemical vapor deposition chamber such that said reaction gas will flow through said chemical vapor deposition chamber from said first end to said second end where said reaction gas exits the chemical vapor deposition chamber;

wherein said reaction gas flows parallel to the surface of the heated mandrel plates and said reaction gas is reacted to form a product which is deposited onto said heated mandrel plates to form a chemical vapor deposited structure.

14. The process of claim 12 wherein the gas utilization efficiency is at least 50%.

15. The process of claim 12 wherein the gas utilization efficiency is at least 55%.

16. The process of claim 12 wherein the gas utilization efficiency is at least 75%.

17. The process of claim 13 wherein the gas utilization efficiency is at least 50%.

18. The process of claim 13 wherein the gas utilization efficiency is at least 55%.

19. The process of claim 13 wherein the gas utilization efficiency is at least 75%.

20. The process of claim 13 wherein the reaction gas is methyltrichlorosilane.

* * * * *

UNITED STATES PATENT AND TRADEMARK OFFICE
CERTIFICATE OF CORRECTION

PATENT NO. : 5,354,580

DATED : October 11, 1994

INVENTOR(S) : Goela et al.

It is certified that error appears in the above-indentified patent and that said Letters Patent is hereby corrected as shown below:

Column 1, line 28, change "SIC" to --SiC--

Column 6, line 55, change "SIC" to --SiC--

Column 8, line 8, change "SIC" to --SiC--
line 24, change "(Wm$^{-K\,-1}$)" to --(Wm$^{-1\,K-1}$)

Column 4, line 13, change "exits" to --exit--
line 58, change "FIG." to --FIGS.--

Column 6, line 18, change "is" to --in--
line 37, insert --a-- after "Normally"; change "furnaces are" to --furnace is--
line 46, delete "length"
line 51, change "71-inch" to --71-inches--

Column 7, line 23, change "32" to --38--

UNITED STATES PATENT AND TRADEMARK OFFICE
CERTIFICATE OF CORRECTION

PATENT NO. : 5,354,580
DATED : October 11, 1994
INVENTOR(S) : Goela, et. al.

It is certified that error appears in the above-indentified patent and that said Letters Patent is hereby corrected as shown below:

Column 8, line 34, change "provide" to --provides--.

Signed and Sealed this

Thirteenth Day of December, 1994

Attest:

BRUCE LEHMAN

Attesting Officer     Commissioner of Patents and Trademarks